(12) United States Patent
Young et al.

(10) Patent No.: US 7,249,335 B1
(45) Date of Patent: Jul. 24, 2007

(54) METHODS OF ROUTING PROGRAMMABLE LOGIC DEVICES TO MINIMIZE PROGRAMMING TIME

(75) Inventors: Jay T. Young, Louisville, CO (US); Jeffrey V. Lindholm, Longmont, CO (US); Sridhar Krishnamurthy, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/590,132

(22) Filed: Oct. 31, 2006

Related U.S. Application Data

(62) Division of application No. 10/716,947, filed on Nov. 18, 2003, now Pat. No. 7,143,384.

(51) Int. Cl.
*G06F 17/50* (2006.01)
(52) U.S. Cl. ............................ 716/12; 716/13; 716/14; 716/16
(58) Field of Classification Search ............. 716/10–16
See application file for complete search history.

(56) References Cited

U.S. PATENT DOCUMENTS

| | | | | |
|---|---|---|---|---|
| 4,815,003 A * | 3/1989 | Putatunda et al. | ............. | 716/9 |
| 5,394,031 A * | 2/1995 | Britton et al. | ................. | 326/38 |
| 5,745,734 A * | 4/1998 | Craft et al. | .................... | 716/16 |
| 5,850,537 A * | 12/1998 | Selvidge et al. | .............. | 716/12 |
| 5,946,478 A * | 8/1999 | Lawman | ....................... | 716/17 |
| 6,075,934 A | 6/2000 | Chiluvuri et al. | | |
| 6,078,736 A * | 6/2000 | Guccione | .................... | 716/16 |
| 6,185,724 B1 | 2/2001 | Ochotta | | |
| 6,216,259 B1 * | 4/2001 | Guccione et al. | ............. | 716/17 |
| 6,353,918 B1 | 3/2002 | Carothers et al. | | |
| 6,487,709 B1 * | 11/2002 | Keller et al. | ................... | 716/14 |
| 6,727,726 B1 * | 4/2004 | Plants | ......................... | 326/41 |
| 6,732,347 B1 | 5/2004 | Camilleri et al. | | |
| 6,757,885 B1 * | 6/2004 | Adusumalli et al. | .......... | 716/18 |
| 6,829,756 B1 * | 12/2004 | Trimberger | .................... | 716/6 |
| 6,907,592 B1 * | 6/2005 | Dante | .......................... | 716/12 |
| 6,957,412 B1 * | 10/2005 | Betz et al. | ..................... | 716/16 |
| 7,146,590 B1 * | 12/2006 | Chaudhary | ..................... | 716/5 |
| 7,149,997 B1 * | 12/2006 | Young et al. | .................. | 716/16 |

OTHER PUBLICATIONS

AT&T Microelectronics; "AT&T Field-Programmable Gate Arrays Data Book"; Lucent Technologies Data Book Apr. 1995; available from Microelectronics Group, Lucent Technologies Inc., 555 Union Boulevard, Room 30L-15P-BA, Allentown, PA 18103; pp. 2-40 thru 2-41.

* cited by examiner

*Primary Examiner*—Jack Chiang
*Assistant Examiner*—Nghia M. Doan
(74) *Attorney, Agent, or Firm*—Lois D. Cartier; LeRoy D. Maunu

(57) ABSTRACT

Methods of routing a design in a programmable logic device (PLD) to increase the effectiveness of applying a multi-frame write (MFW) compression technique to the resulting configuration bitstream. The methods apply placement patterns and/or routing templates to encourage the inclusion of numbers of duplicated routing paths in the routed design. The duplicated routing paths result in duplicated configuration data. Thus, a configuration bitstream implementing the routed design in the PLD includes numbers of duplicated configuration data frames, and is well-suited to benefit from MFW compression techniques.

8 Claims, 6 Drawing Sheets

METHODS OF ROUTING PROGRAMMABLE LOGIC DEVICES TO MINIMIZE PROGRAMMING TIME

FIELD OF THE INVENTION

The invention relates to Programmable Logic Devices (PLDs). More particularly, the invention relates to methods of routing PLD designs to minimize programming time.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure, which typically includes large numbers of interconnect lines interconnected by programmable interconnect points (PIPs). Some FPGAs also include additional logic blocks with special purposes (e.g., DLLs, RAM, processors, and so forth).

The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

As PLDs increase in complexity and size, the number of configuration bits required to program the devices increases significantly. Configuration bitstreams for some FPGAs, for example, are so large that the configuration of the FPGA becomes a significant factor in the initialization of a system. Additionally, the testing process for a PLD typically requires the loading of a large number of configuration bitstreams into the PLD, with tests being performed on the PLD after each configuration. Tester time is expensive, and an inefficient test process requiring a long series of time-consuming configuration steps can significantly increase the cost of a PLD. Therefore, it is desirable to provide methods of reducing bitstream size in order to reduce the configuration time for larger PLDs, both in a testing environment and in the systems that include the PLD after test.

SUMMARY OF THE INVENTION

The invention provides methods of routing a design in a programmable logic device (PLD) to increase the effectiveness of applying a multi-frame write (MFW) compression technique to the resulting configuration bitstream. The methods of the invention apply placement patterns and/or routing templates to encourage the inclusion of numbers of duplicated routing paths in the routed design. The duplicated routing paths result in duplicated configuration data. Thus, a configuration bitstream implementing the routed design in the PLD includes numbers of duplicated configuration data frames, and is well-suited to benefit from MFW compression techniques.

According to one embodiment, the logic placement of a design is analyzed and a list of placement patterns is generated for the design. A placement pattern can be applied to logic placed in specific relative locations with respect to a net, such that two or more nets with the same placement pattern can be routed in the same way. The list of placement patterns includes, for each placement pattern, a list of nets associated with the placement pattern.

The list of placement patterns is then sorted in an order determined by a number of nets associated with each placement pattern. For example, the first placement pattern in the list can be the pattern having the largest number of associated nets, and the last placement pattern in the list can be the pattern having the smallest number of associated nets. The nets associated with each placement pattern are then routed, in order from a placement pattern having the largest number of nets to a placement pattern having a smaller number of nets. The smaller number can be any integer. In one embodiment, the smaller number is four. In some embodiments, the nets for every placement pattern in the list are routed.

When the nets associated with the placement patterns have been routed according to the predetermined criteria, any remaining unrouted nets are routed to produce a fully routed design. A configuration bitstream is created that implements the routed design in the PLD. Because the design was routed using the techniques described above, the configuration bitstream generally includes a large number of repetitive data frames. The configuration bitstream is then compressed using an MFW technique.

BRIEF DESCRIPTION OF THE DRAWINGS

The present invention is illustrated by way of example, and not by way of limitation, in the following figures.

DETAILED DESCRIPTION OF THE DRAWINGS

Figure 1:
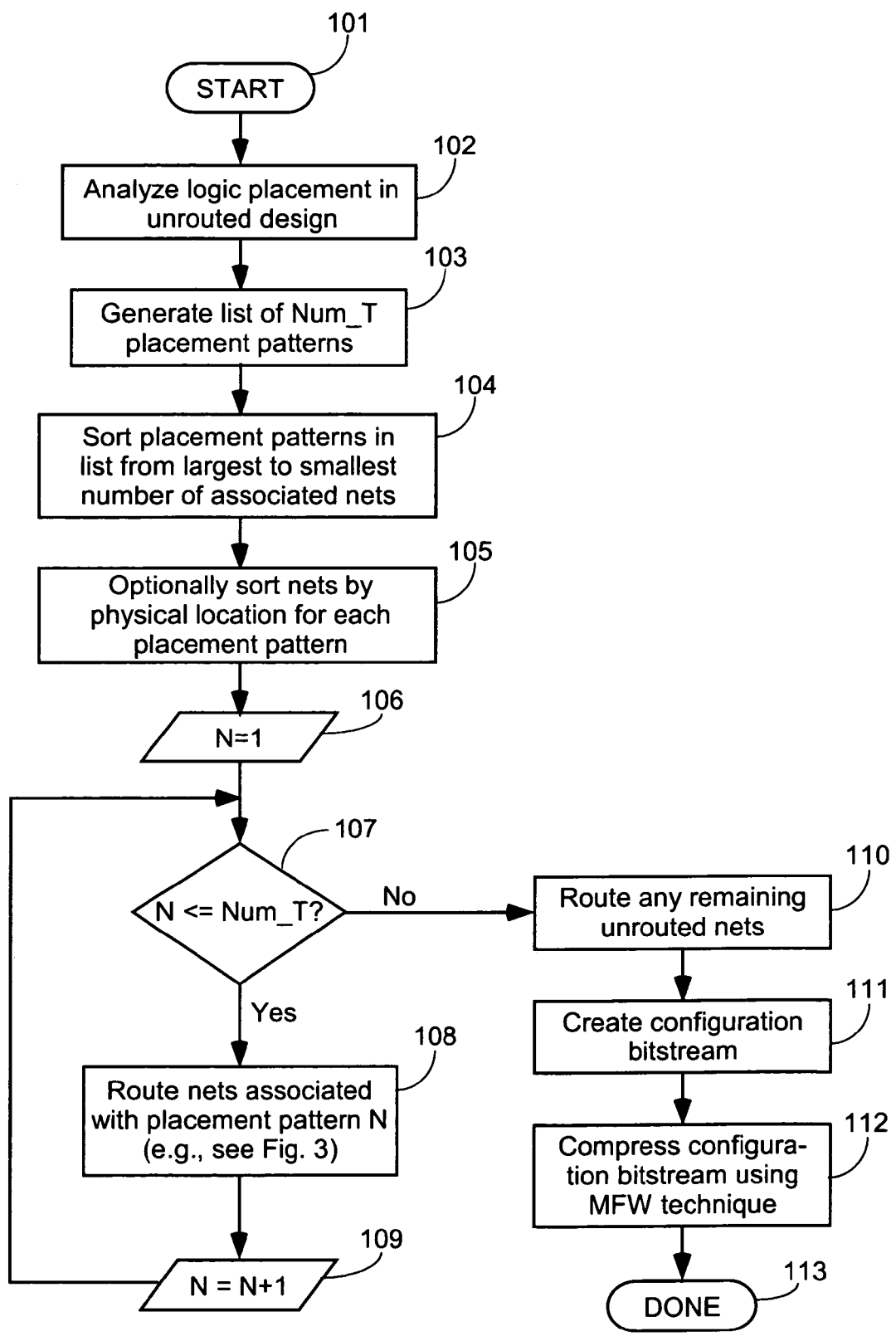
FIG. 1 illustrates the steps of a method of routing a design in a programmable logic device (PLD) to increase the effectiveness of applying a multi-frame write (MFW) compression technique.

The present invention is believed to be applicable to a variety of programmable logic devices (PLDs). The present invention has been found to be particularly applicable and beneficial when applied to field programmable gate arrays (FPGAs). However, the present invention is not so limited. Further, in the following description numerous specific details are set forth to provide a more thorough understanding of the present invention. It will be apparent to one skilled in the art that the present invention can be practiced without these specific details.

A PLD configuration bitstream is typically made up of "frames" of bits. The bits are the initial values of the memory cells included in the PLD, and a frame is a set of bits associated with a set of memory cells. PLDs are typically made up of an array of repeating tiles. For example, as previously described, an FPGA includes an array of configurable logic blocks (CLBs). Because the programmable logic in the PLD is repeated, there are also corresponding repeated memory cells having corresponding repeatable frames of bits. As a simple example, assume a PLD includes 10 columns of logic and routing. Initializing each column requires 10 frames of bits. The first frame in each column programs the memory cells relating to the same resources in each column. The bitstream required to program this hypothetical PLD includes 100 frames of data (10 columns times 10 frames).

As previously described, large PLDs require large bitstreams, and configuring a PLD with a large bitstream can take an undesirably long time. Various techniques have been developed to combat this problem. One such technique is called "multi-frame write" (MFW). An MFW technique is a compression technique for PLD configuration bitstreams that reduces bitstream size by using a single frame of configuration data more than once.

For example, the ORCA$^{TN}$ OR2C Series FPGAs from Lucent Technologies Inc. can use a single frame of configuration data to configure more than one configuration address. ("ORCA" is a trademark of Lucent Technologies, Inc.) The ORCA bitstream compression technique is described in pages 2-40 and 2-41 of the Lucent Technologies April 1995 Data Book entitled "AT&T Field-Programmable Gate Arrays Data Book", available from Microelectronics Group, Lucent Technologies Inc., 555 Union Boulevard, Room 30L-15P-BA, Allentown, Pa. 18103, which are incorporated herein by reference. MFW as used by ORCA FPGAs involves removing configuration data from the bitstream when the data is the same as a directly-preceding frame in the bitstream, and setting a compression bit to indicate that the data from the directly-preceding frame should be repeated. Other MFW techniques are also well known, and can also be used in accordance with the present invention. For example, the Virtex, Virtex-II, and Virtex-II Pro families of FPGAs from Xilinx, Inc. utilize another MFW technique compatible with the methods of the invention.

A configuration bitstream intended to fully configure a particular PLD requires a specific amount of configuration data, i.e., a specific number of configuration data bits. Clearly, the more repetitive the data that appears in the configuration bitstream, the greater the benefit of applying MFW to the configuration bitstream.

One type of design particularly well-suited to the production of repetitive configuration data is the production test design. Designs used to test PLDs are generally composed of logic designed in a step-and-repeat placement pattern across the device, resulting in a regular placement of logic within the unrouted design. However, even with a regular placement of logic, when known routing software is used to perform the routing step it is unlikely that the resulting routed design will be sufficiently repetitive to benefit greatly from MFW.

The present invention addresses this limitation of the prior art. The methods of the invention reduce configuration times for PLDs by deliberately routing designs to produce repetitive configuration data, thereby increasing the benefit of MFW.

FIG. 1 illustrates the steps of a method of routing a design in a PLD to increase the effectiveness of applying an MFW technique to the resulting configuration bitstream. Element 101 provides a starting point for the method. In step 102, the logic placement in the unrouted design is analyzed. An unrouted design is a description of the design that includes implementations and placements of the programmable logic portions of the design, but in which the nets interconnecting the logic portions are not yet connected via the routing resources of the PLD.

The purpose of the logic analysis is to look for placement patterns in the unrouted design. A placement pattern can be applied to logic placed in specific relative locations with respect to a net, such that two or more nets with the same placement pattern can be routed in the same way. For example, a placement pattern can include information about the relative placement associated with a net's source and loads, as well as a list of all nets in the design that have the same placement pattern.

In step 103, a list of placement patterns is provided for the unrouted design. The list includes Num_T placement patterns, where Num_T is an integer.

In step 104, the list of placement patterns is sorted in an order determined by a number of nets associated with each placement pattern. In one embodiment, the list is sorted, in order, from a placement pattern having the largest number of associated nets to a placement pattern having the smallest number of associated nets.

Steps 102, 103, and 104 can occur concurrently and/or interactively. For example, the placement patterns can be sorted by the number of associated nets during the generation of the list of placement patterns.

In step 105, in some embodiments the nets for each placement pattern are also sorted based on the physical location of each net within the PLD. For example, each net has an origin and a destination. The "origin" of a net is the site on the PLD that holds the logic for generating the net, i.e., the source logic for the net. Load (destination) locations for a net are specified relative to the origin. Therefore, a net can be described by specifying only the origin and a routing template. The term "routing template" refers to a relative routing pattern that includes a list of all routing resources necessary to reproduce a routed net. A routing template can be instantiated on a net, which causes the net to be routed in the particular way specified by the routing template.

According to one embodiment, an origin is identified for each net included in the list of placement patterns. Within the list of nets for each placement pattern, the origins are sorted by physical location. The origins might be listed as, for example, (0,0) (0,1) (0,2) (1,0) (1,1) (1,2) (2,0) (2,1) (2,2), where (c,r) indicates the column and row coordinates, respectively, of the lower left-hand corner of the net source.

Figure 2:
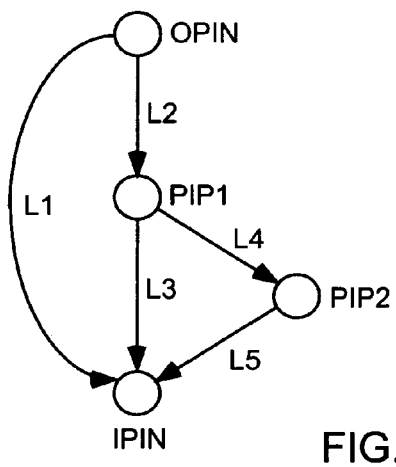
FIG. 2 illustrates a simple exemplary placement pattern and the routing resources associated with the placement pattern.

FIGS. 2 and 2A-2C provide a simple example of a placement pattern, an associated net, and a set of associated routing templates. FIG. 2 illustrates a simple exemplary placement pattern and the routing resources associated with the placement pattern. The placement pattern includes two logic elements OPIN and IPIN. Elements OPIN and IPIN can be, for example, an output pin and an input pin, respectively, of two different configurable logic elements in an FPGA. Routing resources available to provide interconnections from OPIN to IPIN include interconnect lines L1-L5 and programmable interconnect points (PIPs) PIP1 and PIP2.

Figure 2A:
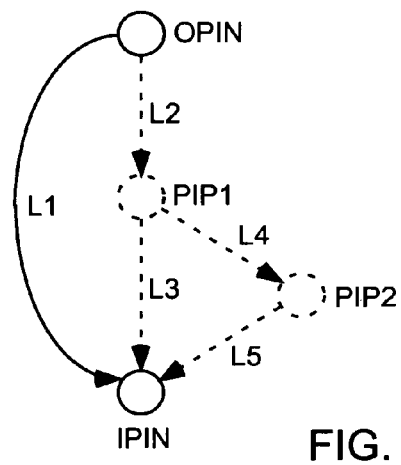
FIGS. 2A-2C show three routing templates that can be applied to the placement pattern of FIG. 2.
Figure 2B:
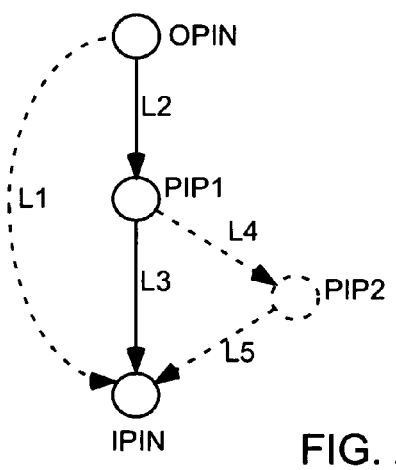
Figure 2C:
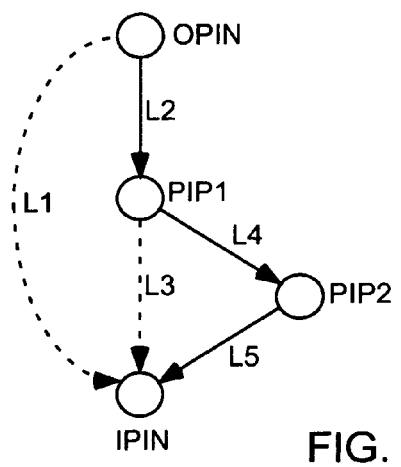
Figure 3:
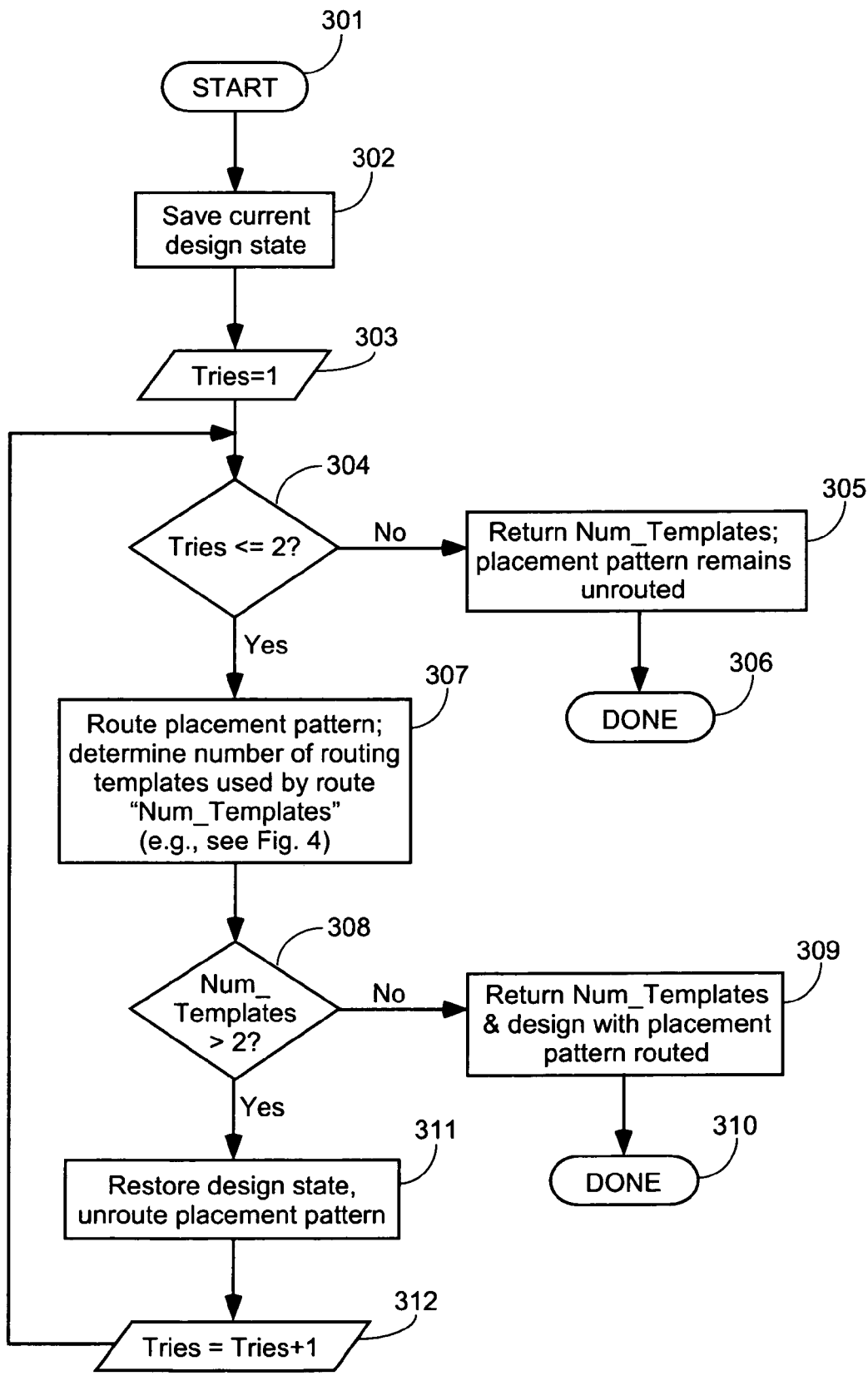
FIG. 3 illustrates the steps of an exemplary method of routing the nets associated with one placement pattern, which can be used, for example, in conjunction with the method of FIG. 1.

FIGS. 2A-2C show three routing templates that can be applied to the placement pattern of FIG. 3. For example, the placement pattern illustrated in FIG. 2 has only one associated net, a net connecting the net source OPIN to the net destination IPIN. Given the available routing resources shown in FIG. 2, three different routing templates can be created for the net. The routing template of FIG. 2A includes one interconnect line L1. Interconnect lines L2-L5 and PIPs PIP1-PIP2 are shown using dotted lines, indicating that these resources are not used to implement the net. The routing template of FIG. 2B includes interconnect line L2, PIP PIP1, and interconnect line L3. The routing template of FIG. 2C includes interconnect line L2, PIP PIP1, interconnect line L4, PIP PIP2, and interconnect line L5.

Returning now to FIG. 1, steps 106-109 implement a loop in which the nets for each placement pattern are routed, one placement pattern at a time. In some embodiments (e.g., the embodiment of FIG. 1), the associated nets for all placement patterns are routed. In some embodiments, the associated nets are routed for only some of the placement patterns. For example, nets can be routed only for placement patterns for which the number of nets equals or exceeds a predetermined threshold. In some embodiments, this threshold is four.

In step 106, a variable N is set to "1". In decision step 107, the variable N is tested. If N is less than or equal to Num_T (i.e., if N indicates a placement pattern in the list of Num_T placement patterns), the method proceeds to step 108, where the nets associated with the indicated (Nth) placement pattern are routed. In step 109, N is incremented and the method returns to step 107 to process the next placement pattern in the list.

In decision step 107, if N is more than Num_T (i.e., if N exceeds the number Num_T of placement patterns in the list), all of the placement patterns in the list have been processed. The method proceeds to step 110, where any remaining nets in the design are routed. In some embodiments, all nets are routed in step 108 before exiting the loop to step 110. However, routing all nets for a placement pattern leaves fewer routing resources for other nets, associated with other placement patterns, that can utilize a larger number of routing templates. Therefore, in some embodiments some nets are left unrouted, e.g., nets that when routed utilize only a small number of routing templates. These remaining nets are routed in step 110.

In step 111, a configuration bitstream is created for the fully routed design resulting from step 110. In step 112, the configuration bitstream is compressed using an MFW technique. Because of the above-described process, which increases the repetition of configuration data frames within the bitstream, MFW is more effective than when applied to a design routed using conventional techniques. Element 113 indicates that the process illustrated in FIG. 1 is complete.

FIG. 3 illustrates the steps of an exemplary method of performing step 108 of FIG. 1, i.e., of routing the nets associated with one placement pattern. (In other embodiments, other methods are used to perform step 108.) Essentially, the current state of the design (with the nets of the current placement pattern unrouted) is saved before beginning the routing process. The nets associated with the placement pattern are then routed, and the result of the route (the number of routing templates utilized) is evaluated. If the route is satisfactory according to a predetermined criterion (e.g., two or fewer routing templates are utilized), the routing for the nets is saved and the routing for that placement pattern is complete. If the route is unsatisfactory (e.g., more than two routing templates are utilized), the previous state of the design is restored, and the nets associated with the placement pattern remain unrouted. Therefore, all previously-unused routing resources remain available for the use of nets that can utilize a larger number of routing templates. In some embodiments, a second attempt is made to obtain a satisfactory route, drawing on an increased cache of routing templates.

Element 301 provides a starting point for the method of FIG. 3. In step 302, the current state of the design (with the current placement pattern unrouted) is saved pending the result of the present routing attempt.

Steps 303-312 implement a loop in which two attempts are made to obtain a satisfactory route for the nets associated with the placement pattern. In step 303, a variable "Tries" is set to one. In decision step 304, if Tries is greater than two (i.e., if two attempts have already been made to obtain a satisfactory route), the nets associated with the placement pattern remain unrouted. A value Num_Templates is optionally returned (step 305). The value Num_Templates provides feedback information on how many routing templates were utilized by the most recent routing attempt. The routing process ends unsuccessfully (element 306).

In decision step 304, if Tries is less than or equal to two (fewer than two attempts have been made to obtain a satisfactory route), the method continues at step 307, where the placement pattern is routed. The number of routing templates used by the route (Num_Templates) is determined.

In decision step 308, the route is evaluated to determine whether two or fewer routing templates were utilized. If so, the current route is retained for the nets associated with the current placement pattern (step 309). The value Num_Templates is also optionally returned, providing feedback information on how many routing templates were utilized by the successful routing attempt. The routing process ends successfully (element 310).

In decision step 308, if more than two routing templates were utilized, the route is considered to be unacceptable. The design state previous to the route is restored (step 311), i.e., the placement pattern is unrouted. The variable Tries is incremented (step 312), and the method resumes at step 304.

Figure 4:
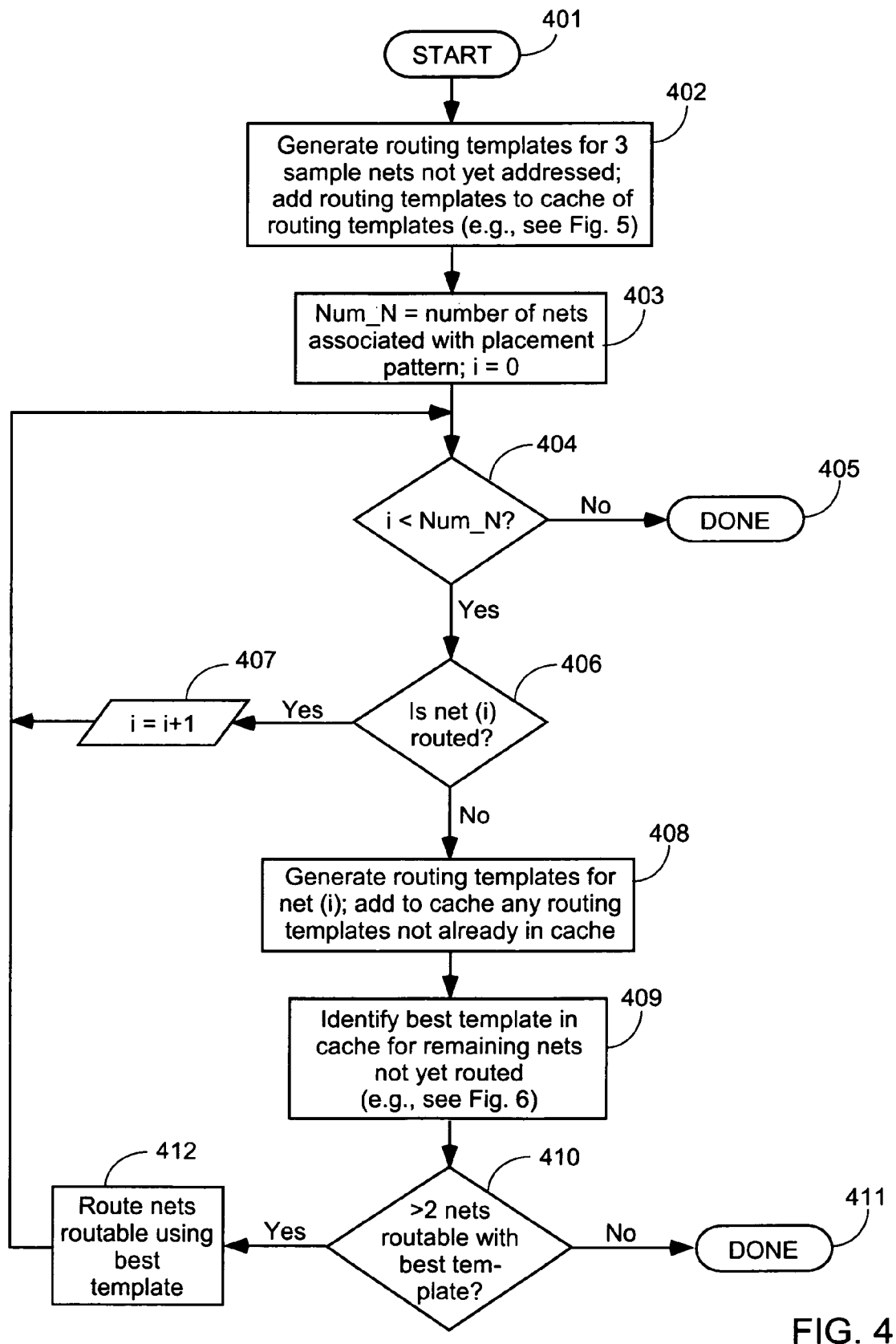
FIG. 4 illustrates the steps of making one attempt to route the nets associated with one placement pattern, which can be used, for example, in conjunction with the method of FIG. 3.

FIG. 4 illustrates the steps of an exemplary method of performing step 307 of FIG. 3, i.e., of making one attempt to route the nets associated with one placement pattern. (In other embodiments, other methods are used to perform step 307.) Element 401 provides a starting point for the process.

In step 402, a cache of routing templates is created or augmented, e.g., by taking a sample of nets associated with the placement pattern and adding routing templates for each of the sample nets to the cache. Initially, the cache of routing templates is empty, and the entire list of new routing templates is added to the cache. If the attempt is a second attempt at routing the placement pattern (see FIG. 3), any of the routing templates not already in the cache are added to the existing cache. The sample of nets can be selected in various ways. In some embodiments, the sample nets are randomly selected. In some embodiments, the sample nets are selected to have origins located in different physical areas of the PLD. In the pictured embodiment, the number of sample nets is three. However, other numbers of samples can be used.

In other embodiments, rather than taking a sampling of nets associated with the placement pattern, routing templates are created for every net associated with the placement pattern. However, this approach can undesirably increase the run-time for the software performing the process.

For some nets, the total number of possible routing templates can be very large. For example, a routing path could theoretically traverse the entire PLD many times to connect two pins located in adjacent logic blocks. Therefore, in some embodiments a limit is set to the number of routing templates added to the cache for each net. In some embodiments, 100 routing templates are created for each net. In other embodiments, other numbers of routing templates are created.

In steps 403-412, for each net associated with the placement pattern, the best template in the cache is identified, e.g., based on which routing template can be used to route the largest number of remaining unrouted nets. If the best template can be used to route more than a predetermined number of unrouted nets (e.g., two), the unrouted nets associated with the placement pattern that can be routed with the best template are routed, and the process moves on to the next unrouted net associated with the placement pattern. When the best template proves inadequate to route the predetermined number of unrouted nets (e.g., two), the process terminates.

In step 403, a variable Num_N is assigned a value that corresponds to the number of nets associated with the current placement pattern. Variable "i" (an index to the nets) is set to "0".

In decision step 404, if variable "i" is greater than or equal to Num_N (i.e., if all nets associated with the current placement pattern have already been processed), the process is complete (element 405). If variable "i" is less than Num_N (i.e., if net (i) is on the list of nets associated with the current placement pattern), the method continues at step 406. In decision step 406, if net (i) is already routed, variable "i" is incremented (step 407) and the process continues at step 404 with the next value of "i". If net (i) has not yet been routed, the method continues at step 408, where a set of routing templates is generated for net (i). Any routing templates not already in the cache of routing templates are added to the cache.

In step 409, the "best" template in the cache is identified. Various criteria can be used to determine the best template in the cache. For example, the best template can be a routing template that can be applied to a largest number of the nets associated with the placement pattern that have not yet been routed. As another example, the best template can be a routing template that uses a largest number of previously unused routing resources in the PLD.

In decision step 410, if two or fewer nets are routable with the best template, the route is considered complete (element 411). Not all nets are routed, but the greatest benefit available from applying the method has been obtained. If the best template can be used to route more than two nets, the nets are routed using the best template (step 412), and the method continues for the next net in the list of nets associated with the current placement pattern (step 404).

Figure 5:
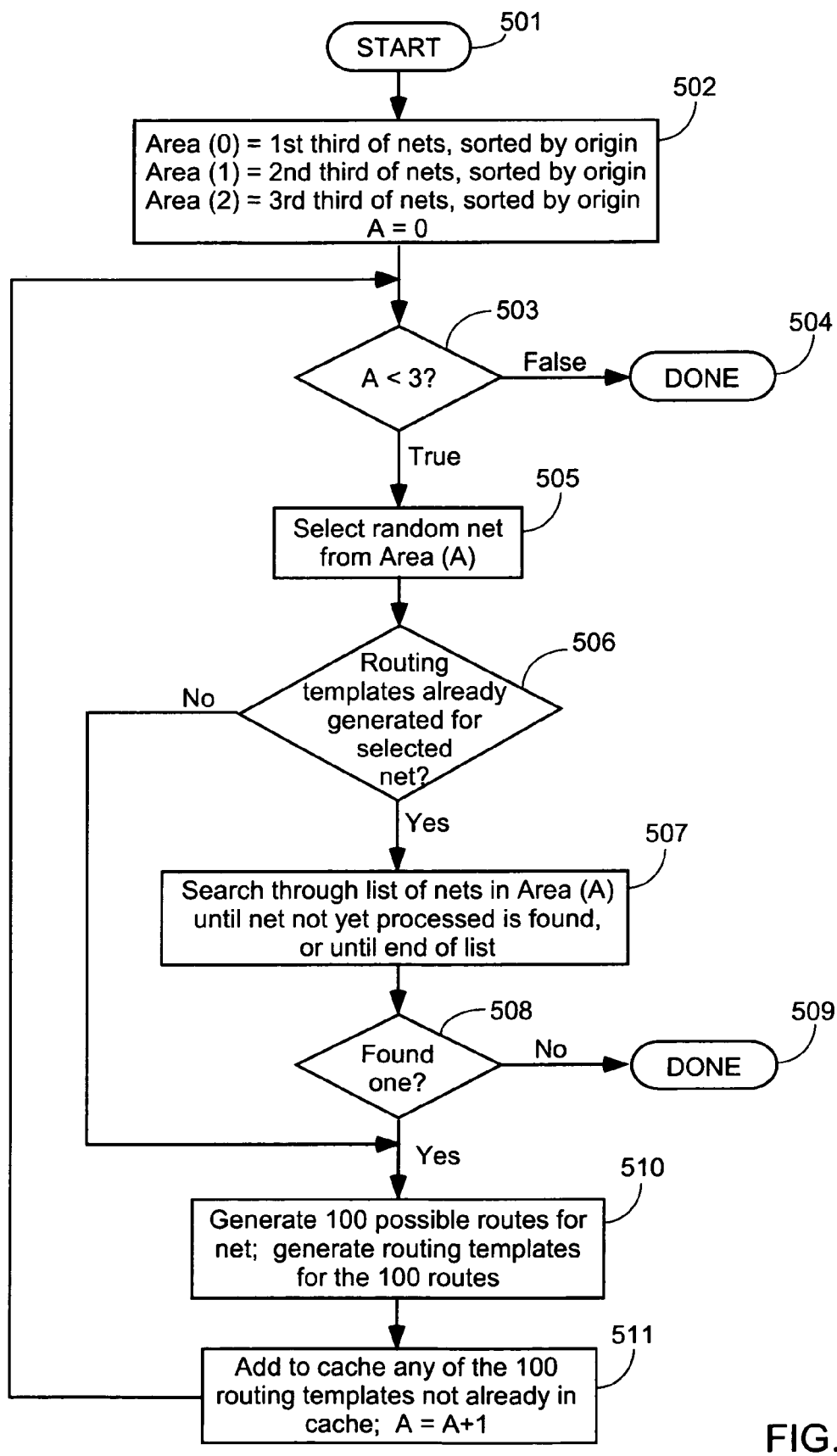
FIG. 5 illustrates the steps of an exemplary method of selecting a sample of nets from the placement pattern, and adding routing templates for the sample nets to a cache of routing templates. The steps shown in FIG. 5 can be used, for example, in the method of FIG. 4.

FIG. 5 illustrates the steps of an exemplary method of performing step 402 of FIG. 4, i.e., of creating or augmenting a cache of routing templates. (In other embodiments, other methods are used to perform step 402.) In the pictured embodiment, a sample of nets is selected based on the physical locations of the origins of the nets. To use this method, the nets for each placement pattern in the list of placement patterns should be sorted by physical location (see step 105 in FIG. 1).

Element 501 provides a starting point for the process. In step 502, the list of nets is divided into three areas (Area (0), Area (1), and Area (2)), based on the physical location of the origin of the net within the PLD. Variable A (an index to the areas) is set to zero. In the pictured embodiment, three different areas are used, an area corresponding to the left side of the PLD (Area (0)), an area corresponding to the core area of the PLD (Area (1)), and an area corresponding to the right side of the PLD (Area (2)). However, in other embodiments, other areas and other numbers of areas are used.

In steps 503-511, for each area one random net is selected. If routing templates have not yet been generated for this net, 100 possible routes are generated for the net, and routing templates are generated for the routes. Any of the routing templates that are not already in the cache of routing templates are added to the cache.

In decision step 503, if variable A is three or more (i.e., if all areas have been sampled), the process is complete (element 504). If variable A is less than three (i.e., if the current area has not yet been sampled), a net is randomly selected from Area (A) (step 505).

In decision step 506, if routing templates have already been generated for the selected net, a search (e.g., a linear search) is conducted through the list of nets in Area (A) (step 507). The search continues until a net is found that has not yet been processed, or until the end of the list is reached. If no unprocessed net is found (decision step 508), the process is complete (element 509). If an unprocessed net is found, the method continues at step 510.

In decision step 506, if routing templates have not yet been generated for the selected net, 100 possible routes for the net are generated, and routing templates for the possible routes are produced (step 510). In step 511, any of the new routing templates that are not already in the cache of routing templates are added to the cache. Variable A is incremented to indicate the next area, and the method continues at step 503.

As previously described, the number of sample nets and the number of routing templates generated for each of the sample nets varies in different embodiments.

Figure 6:
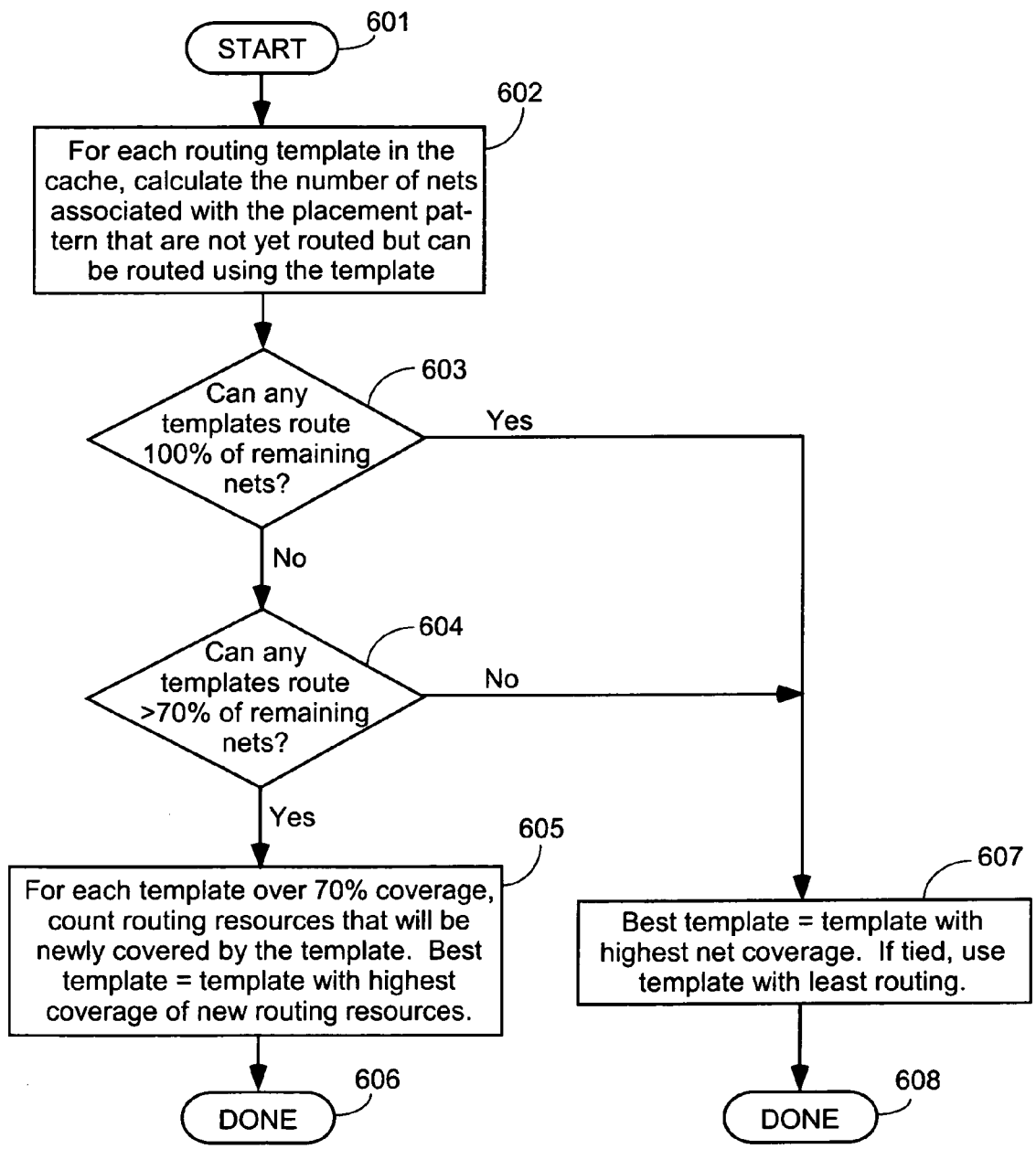
FIG. 6 illustrates the steps of an exemplary method of selecting a best template from the cache of routing templates. The steps shown in FIG. 6 can be used, for example, in the method of FIG. 4.

FIG. 6 illustrates the steps of an exemplary method of performing step 409 of FIG. 4, i.e., of identifying a best template in the cache for the remaining nets that are not yet routed. (In other embodiments, other methods are used to perform step 409.) In the pictured embodiment, two different criteria are used to select the best template. A first criterion is based on the highest number of resulting routed nets. A second criterion is especially useful when routing test designs, e.g., designs to be used for testing routing resources in a PLD. The second criterion rates routing templates based in part on their use of previously unused (and, therefore, previously untested) routing resources within the PLD.

Element 601 provides a starting point for the method illustrated in FIG. 6. In step 602, a number is calculated for each routing template in the cache. The number indicates the number of nets associated with the placement pattern that are not yet routed, but can be routed using the routing template.

Decision step 603 determines whether any of the routing templates in the cache can be used to route all (100%) of the nets that are still unrouted. If so, the "best template" is considered to be the template that has the highest net coverage, which in this case is 100% (step 607). If more than one net has the highest net coverage, the best template is the one of these templates that uses the fewest routing resources. The method terminates at element 608.

If decision step 603 determines that none of the routing templates in the cache can be used to route all of the nets, the method proceeds to step 604. Decision step 604 determines whether any of the routing templates in the cache can be used to route more than seventy percent (70%) of the nets that are still unrouted. If not, the method continues at step 607, i.e., the best template is the template that has the highest net coverage, with ties being broken in favor of the routing template that uses the fewest routing resources.

If decision step 604 determines that at least one of the routing templates in the cache can be used to route more than seventy percent of the nets that are still unrouted, all nets meeting this criterion are considered equal until the next test is applied (step 605). The next test applied is how many new routing resources are used by the routing template. A new routing resource is a routing resource in a PLD (e.g., an interconnect line or a PIP) that is not yet included in any of the test designs for the PLD. Clearly, any routing resources not included in a test design cannot be tested. Therefore, it is desirable for a routing template to include new (untested) routing resources. Hence, in step 605 the "best template" is the template from the group providing more than seventy percent coverage that provides the highest coverage of new routing resources. Following the selection of the best template, the method terminates at element 606.

In some embodiments, a user can select between two or more different modes for selecting the best template, e.g., the two criteria shown in steps 605 and 607 of FIG. 6.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Accordingly, all such modifications and additions are deemed to be within the scope of the invention, which is to be limited only by the appended claims and their equivalents.

What is claimed is:

1. A method of routing a design in a programmable logic device (PLD) to increase the effectiveness of applying a multi-frame write (MFW) technique, the method comprising:

analyzing logic placement in the design;

generating a list of placement patterns as a result of analyzing the logic placement, the list of placement patterns including a list of nets associated with each placement pattern;

wherein each net includes a source and one or more loads, and each net associated with a placement pattern has placement of the source relative to placement of the loads identical to each other net associated with the placement pattern;

sorting the list of placement patterns in an order determined by a number of nets associated with each placement pattern;

routing the nets associated with each placement pattern, in order from a placement pattern having a largest number of nets to a placement pattern having a smaller number of nets, to produce a fully routed design;

generating a configuration bitstream for fully routed design; and compressing the configuration bitstream using the MFW technique, wherein the routing includes, in response to a placement pattern having more than two associated nets, determining whether more than two nets associated with the placement pattern are routable with one selected routing template, wherein a routing template specifies relative routing resources that represent a pattern of a possible route for all the nets associated with the placement pattern, and in response to determining that more than two nets associated with the routing pattern are routable with the one selected routing pattern, routing the more than two nets consistent with the one selected routing template.

2. The method of claim 1, wherein the smaller number of nets is a predetermined threshold number.

3. The method of claim 2, wherein the predetermined threshold number is four.

4. The method of claim 1, wherein routing the nets associated with each placement pattern does not result in a fully routed design, the method further comprising:

routing the nets associated with the placement patterns having a number of nets less than the smaller number of nets to produce a fully routed design.

5. The method of claim 4, further comprising:

generating a configuration bitstream for the fully routed design; and compressing the configuration bitstream using an MFW technique.

6. The method of claim 1, wherein the PLD is a field programmable gate array (FPGA).

7. An apparatus for routing a design in a programmable logic device (PLD) to increase the effectiveness of applying a multi-frame write (MFW) technique, the method comprising:

means for analyzing logic placement in the design;

means for generating a list of placement patterns as a result of analyzing the logic placement, the list of placement patterns including a list of nets associated with each placement pattern, wherein each net includes a source and one or more loads, and each net associated with a placement pattern has placement of the source relative to placement of the loads identical to each other net associated with the placement pattern;

means for sorting the list of placement patterns in an order determined by a number of nets associated with each placement pattern;

means for routing the nets associated with each placement pattern, in order from a placement pattern having a largest number of nets to a placement pattern having a smaller number of nets, to produce a fully routed design;

means for generating a configuration bitstream for fully routed design; and means for compressing the configuration bitstream using the MFW technique, wherein the means for routing includes, means, responsive to a placement pattern having more than two associated nets, for determining whether more than two nets associated with the placement pattern are routable with one selected routing template, wherein a routing template specifies relative routing resources that represent a pattern of a possible route for all the nets associated with the placement pattern, and means, responsive to determining that more than two nets associated with the routing pattern are routable with the one selected routing pattern, for routing the more than two nets consistent with the one selected routing template.

8. An article of manufacture, comprising:

a computer readable medium configured with instructions that when executed by a computer cause the computer to perform a method of routing a design in a programmable logic device (PLD) to increase the effectiveness of applying a multi-frame write (MFW) technique, the method including, analyzing logic placement in the design;

generating a list of placement patterns as a result of analyzing the logic placement, the list of placement patterns including a list of nets associated with each placement pattern;

wherein each net includes a source and one or more loads, and each net associated with a placement pattern has placement of the source relative to placement of the loads identical to each other net associated with the placement pattern;

sorting the list of placement patterns in an order determined by a number of nets associated with each placement pattern;

routing the nets associated with each placement pattern, in order from a placement pattern having a largest number of nets to a placement pattern having a smaller number of nets, to produce a fully routed design;

generating a configuration bitstream for fully routed design; and compressing the configuration bitstream using the MFW technique, wherein the routing includes, in response to a placement pattern having more than two associated nets, determining whether more than two nets associated with the placement pattern are routable with one selected routing template, wherein a routing template specifies relative routing resources that represent a pattern of a possible route for all the nets associated with the placement pattern, and in response to determining that more than two nets associated with the routing pattern are routable with the one selected routing pattern, routing the more than two nets consistent with the one selected routing template.

* * * * *